(12) United States Patent
Knorr et al.

(10) Patent No.: US 7,125,782 B2
(45) Date of Patent: Oct. 24, 2006

(54) AIR GAPS BETWEEN CONDUCTIVE LINES FOR REDUCED RC DELAY OF INTEGRATED CIRCUITS

(75) Inventors: Andreas Knorr, Austin, TX (US); Bernd Kastenmeier, Austin, TX (US); Naim Moumen, Austin, TX (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 7 days.

(21) Appl. No.: 10/965,370

(22) Filed: Oct. 14, 2004

(65) Prior Publication Data

US 2006/0081830 A1    Apr. 20, 2006

(51) Int. Cl.
*H01L 21/764* (2006.01)
(52) U.S. Cl. .................. 438/421; 438/619; 257/522
(58) Field of Classification Search ............... 438/421
See application file for complete search history.

(56) References Cited

U.S. PATENT DOCUMENTS

| 5,461,003 | A  | * | 10/1995 | Havemann et al. | ......... | 438/666 |
| 6,165,890 | A  | * | 12/2000 | Kohl et al. | .................. | 438/619 |
| 6,815,329 | B1 | * | 11/2004 | Babich et al. | ............... | 438/619 |
| 6,903,461 | B1 | * | 6/2005  | Kloster et al. | ............... | 257/759 |
| 6,943,121 | B1 | * | 9/2005  | Leu et al. | .................... | 438/725 |
| 2004/0248400 | A1 | | 12/2004 | Kim et al. | | |
| 2004/0259273 | A1 | | 12/2004 | Kim et al. | | |

OTHER PUBLICATIONS

Kohl, P.A.; Fabrication of air-channel structures for microfluidic, microelectromechanical, and microelectronic applications; IEEE JNL; Journal of Microelectromechanical Systems, vol. 10, Issue 3 Sep. 2001; http://ieeexplore.ieee.org.*

Gabric, Z., et al., "Air Gap Technology by Selective Ozone/TEOS Deposition," IITC 2004, Jul. 2004, pp. 151-153, IEEE.

Gosset, L.G., et al., "General Review of Issues and Perspectives for Advanced Copper Interconnections Using Air Gap as Ultra-low K Material," IITC 2003, Apr. 2003, pp. 65-67, IEEE.

"JSR—NGL Technology: Photoresists: Others," downloaded Jun. 10, 2005, 6 pages, JSR Micro, Inc., http://www.jsrmicro.com/pro_photo_otherNGL.html.

Loo, L.S., et al., "Chemical Vapor Deposition (CVD) and Characterization of Polymers and Polymeric Thin Films," 2003 Materials Research at MIT, downloaded Jun. 10, 2005, 4 pages, http://mpc-web.mit.edu/about_mpc/ar2003/gleason.pdf, Massachusetts Institute of Technology, Cambridge, MA.

(Continued)

*Primary Examiner*—Douglas W. Owens
*Assistant Examiner*—Earl N. Taylor
(74) *Attorney, Agent, or Firm*—Slater & Matsil, L.L.P.

(57) ABSTRACT

Methods of forming air gaps or porous dielectric materials between interconnects of integrated circuits and structures thereof. Air gaps or highly porous dielectric material having a dielectric constant of close to or equal to 1.0 are formed in a first region but not a second region of an interconnect layer. The air gaps or highly porous dielectric material are formed by depositing a first insulating material comprising an energy-sensitive material over a workpiece, depositing a second insulating material over the first insulating material, and exposing the workpiece to energy. At least a portion of the first insulating material in the first region is removed through the second insulating material. Structurally stable insulating material is disposed between conductive lines in the second region of the workpiece, providing mechanical strength for the integrated circuit.

37 Claims, 10 Drawing Sheets

OTHER PUBLICATIONS

Noguchi, J., et al., "Reliability of Air-Gap Cu Interconnect and Approach to Selective W Sealing using 90nm Node Technology," Jul. 2004, pp. 81-83, IEEE.

Noguchi, J., et al., "Simple Self-Aligned Air-Gap Interconnect Process with Cu/FSG Structure," IITC 2003, Apr. 2003, pp. 68-70, IEEE.

Saito, T., et al., "A Robust, Deep-Submicron Copper Interconnect Structure using Self-Aligned Metal Capping Method," IITC 2004, Jul. 2004, pp. 36-38, IEEE.

Sudijono, J., IEDM 2004—Short Course: 45nm BEOL, Dec. 2004, pp. 43-44.

Wolf, S., et al., "Silicon Processing for the VLSI Era," 2000, p. 128, vol. 1, Lattice Press, Sunset Beach, CA, USA.

Wolf, S., et al., "Silicon Processing for the VLSI Era," 2000, pp. 719-723, vol. 1, Lattice Press, Sunset Beach, CA, USA.

* cited by examiner

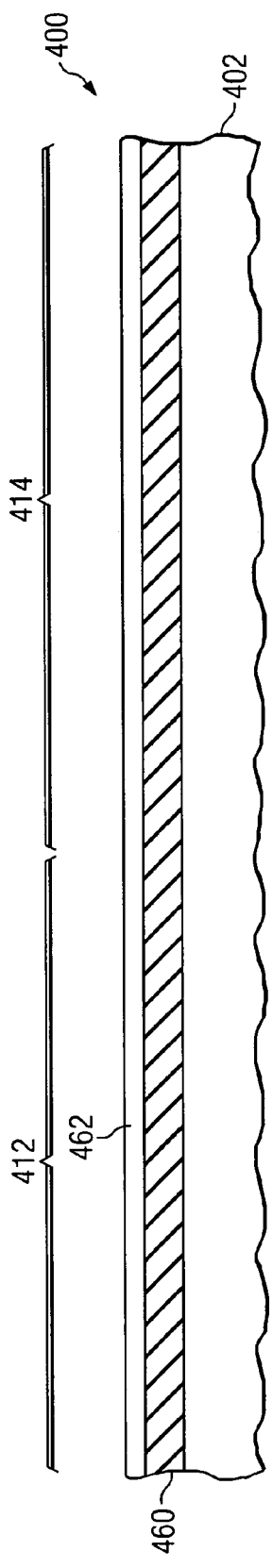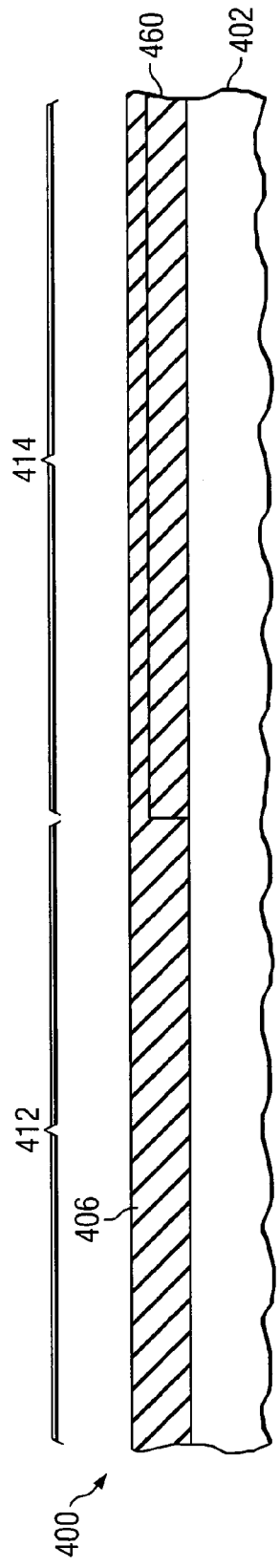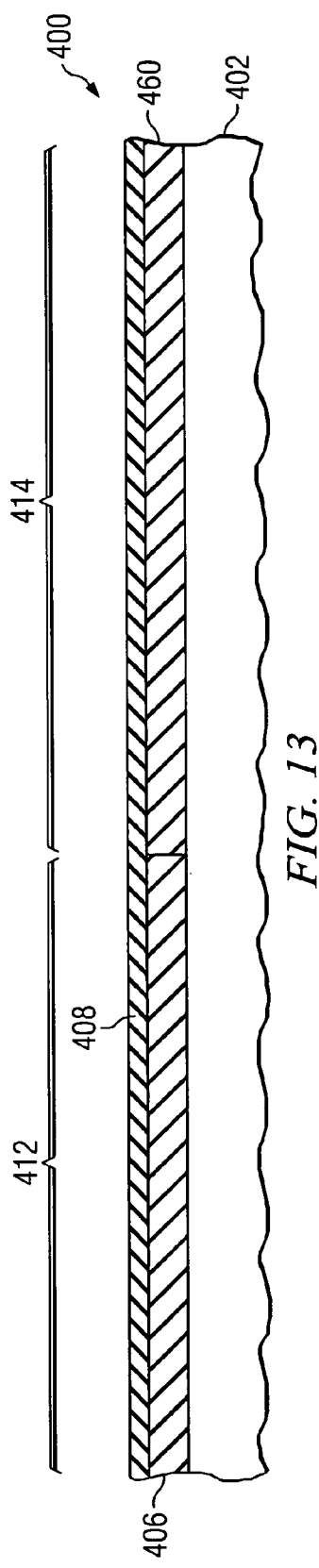

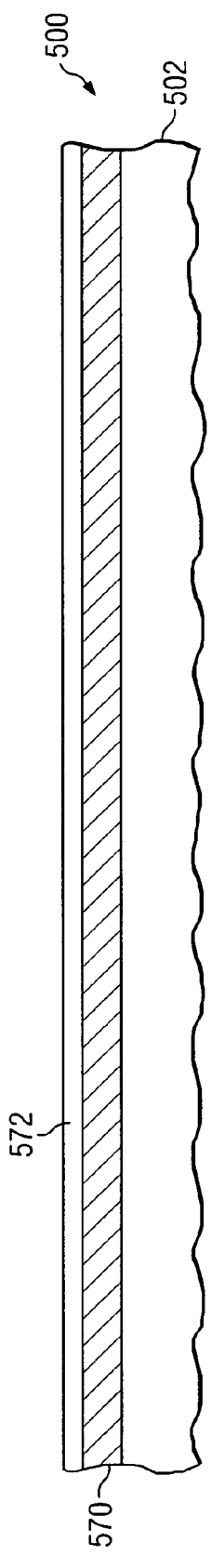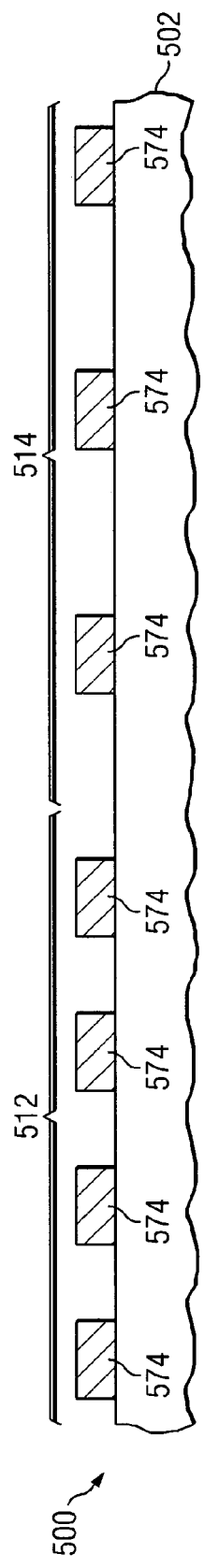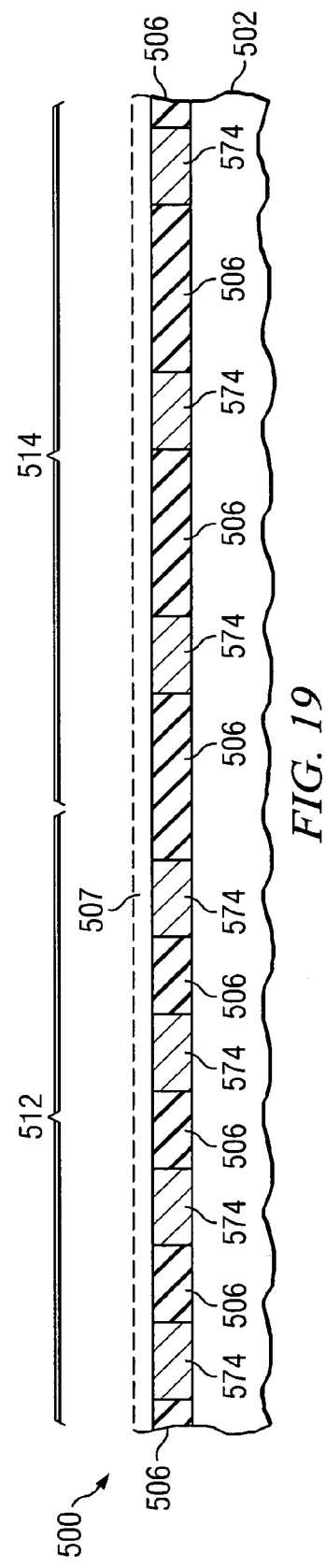

AIR GAPS BETWEEN CONDUCTIVE LINES FOR REDUCED RC DELAY OF INTEGRATED CIRCUITS

TECHNICAL FIELD

The present invention relates generally to the fabrication of semiconductor devices, and more particularly to the formation of insulating materials of interconnect layers.

BACKGROUND

Semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices typically include several layers of insulating, conductive and semiconductive materials that are patterned to form integrated circuits. There may be a plurality of transistors, memory devices, switches, conductive lines, diodes, capacitors, logic circuits, and other electronic components formed on a single die or chip. Semiconductor technology has experienced a trend towards miniaturization, to meet the demands of product size reduction, improved device performance, and reduced power requirements in the end applications that semiconductors are used in, for example.

In the past, integrated circuits contained only a relatively small number of devices per chip, and the devices could be easily interconnected. However, in more recent integrated circuit designs, there may be millions of devices on a single chip, resulting in the need for multilevel interconnect systems, wherein the area for interconnect lines is shared among two or more material levels.

The manufacturing process for semiconductor devices is typically referred to in two phases: the front-end-of-line (FEOL) and the back-end-of-line (BEOL). The FEOL is defined as the process steps that begin with a starting wafer up to the formation of the first metallization layer, and the BEOL is defined as all process steps from that point forward. The interconnect lines of an integrated circuit are usually formed in the BEOL.

As the minimum line width on an integrated circuit becomes smaller, the active device density increases, and transistor switching speed decreases, while signal propagation delays in the interconnect system become limiting on the performance of the integrated circuit. Also, as the chip size increases, the interconnect path lengths also increase. Thus, many large ultra-large scale integration (ULSI) integrated circuits are limited by interconnect propagation delay time.

The propagation delay of integrated circuits becomes limited by the RC delay of the interconnection lines when the minimum feature size is decreased below about 0.25 µm for example, which limits the circuit speeds. The RC delay refers to the resistance of the conductive lines used for the interconnect and the capacitance between the conductive lines.

One challenge in the semiconductor industry is to reduce and minimize the RC delay of integrated circuits, to improve device performance and increase device speed. The resistive or R component of RC delay is being addressed by the move from the use of aluminum to copper, which has a lower resistance than aluminum, as the material of conductive lines. The C or capacitive component of RC delay is being addressed by attempts to use insulating materials between the conductive lines that comprise a lower dielectric constant (k) than materials such as $SiO_2$ that were used in the past for inter-metal dielectric (IMD).

What is needed in the art are improved methods of lowering the capacitive component C of the RC delay in integrated circuits.

SUMMARY OF THE INVENTION

These and other problems are generally solved or circumvented, and technical advantages are generally achieved, by preferred embodiments of the present invention, which provide methods of forming highly porous areas or air gaps between conductive lines of semiconductor devices.

In accordance with a preferred embodiment of the present invention, a method of forming insulating regions between conductive lines of a semiconductor device includes providing a workpiece, the workpiece comprising a first region and a second region, and forming a plurality of conductive lines over the workpiece in the first region and the second region, a first insulating material between the plurality of conductive lines in at least the first region of the workpiece, and a second insulating material over at least the first insulating material. The workpiece is exposed to energy, and at least a portion of the first insulating material in the first region is removed from between the plurality of conductive lines through the second insulating material.

In accordance with another preferred embodiment of the present invention, a semiconductor device includes a workpiece, the workpiece comprising a first region and a second region, a plurality of first conductive lines formed over the workpiece, and a first insulating material disposed between the plurality of first conductive lines in the second region, the first insulating material comprising a first material. A second insulating material is disposed over the first insulating material between the plurality of first conductive lines in the first region and the second region, the second insulating material comprising a second material, the second material being different from the first material. A porous portion of the first material, or no portion of the first material, is disposed between the plurality of first conductive lines in the first region.

In accordance with yet another preferred embodiment of the present invention, a semiconductor device includes a workpiece, the workpiece comprising a first region and a second region, a plurality of first conductive lines formed over the workpiece, and an energy insensitive insulating material disposed between the plurality of first conductive lines in the second region. A porous portion of a first insulating material is disposed between the plurality of first conductive lines in the first region, and a second insulating material is disposed over the porous portion of the first insulating material in the first region and disposed over the energy insensitive insulating material in the second region.

In accordance with another preferred embodiment of the present invention, a semiconductor device includes a workpiece, the workpiece comprising a first region and a second region, a plurality of first conductive lines formed over the workpiece, and an energy insensitive insulating material disposed between the plurality of first conductive lines in the second region. An air gap is disposed between each of the plurality of first conductive lines in the first region. A second insulating material is disposed over the air gaps in the first region and disposed over the energy insensitive insulating material in the second region.

Advantages of preferred embodiment of the present invention include forming air gaps and/or highly porous dielectric material in critical areas, but not in non-critical areas, where the RC delay is not an issue. Because some regions of the workpiece do not have the air gaps or highly porous dielectric material disposed therein, the insulating material in those regions provides strong structural support and mechanical strength for the integrated circuit. An integrated circuit having air gaps between conductive lines in some regions but not in others, with a high level of mechanical stability and increased reliability is provided.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 11 through 16 show an embodiment of the present invention implemented in a damascene structure, wherein an energy insensitive material is used as a dielectric for one region of the workpiece, so that the entire workpiece may be exposed to energy to form air gaps in one region of the workpiece;

FIGS. 17 through 20 show an embodiment of the present invention implemented in a structure having conductive lines formed by a subtractive etch process.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
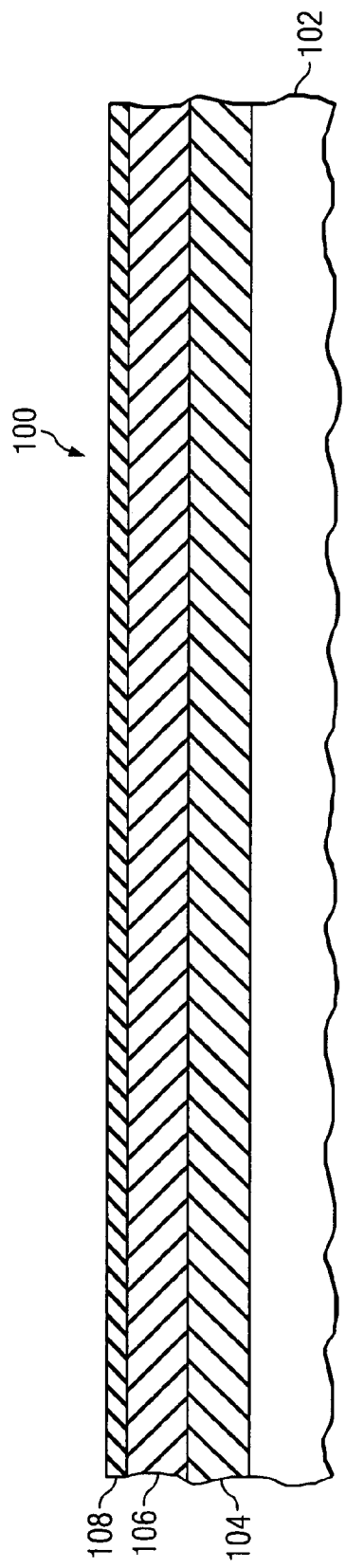
FIGS. 1 through 8 show cross-sectional view of preferred embodiments of the present invention at various stages of manufacturing, wherein a highly porous dielectric or air gaps are formed in a closely-spaced region of a dual damascene interconnect structure.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely semiconductor device having multiple layers of interconnect. The invention may also be applied, however, to semiconductor devices having a single layer of interconnect, for example.

The capacitance C in the RC delay of BEOL interconnect may be lowered by the use of low-k materials. For example, silicon dioxide ($SiO_2$), commonly used as an interconnect insulating material in the past, has a dielectric constant k of about 4.1 or 4.2. A dense low-k material may have a k value of about 2.8, for example, whereas a porous low-k material may have a k value of about 2.2, for example. However, lowering the dielectric constant to a value lower than about 2.2 is difficult, because the porosity of the insulating materials becomes larger as the dielectric constant decreases; thus, the low k insulating material becomes weaker.

Theoretically, air is an ideal dielectric, having a dielectric constant of 1.0. However, a problem with using air as an insulating material between conductive lines is that the structure can easily collapse under mechanical stress, e.g., during further manufacturing processing, testing, packaging, or transportation, destroying the integrated circuit. An interconnect system needs to be workable, reliable, and mechanically stable, so that the chip can be manufactured and packaged, for example. An integration scheme for introducing air between conductive lines without collapsing the interconnect structure, and for manufacturing an interconnect system having air gaps between conductive lines that does not easily collapse, is needed in the art.

Embodiments of the present invention achieve technical advantages by providing an integration scheme, structure, and method of manufacture thereof, wherein air gaps or very porous dielectric materials are formed as an insulating material between conductive lines. The air gaps or highly porous dielectric material are preferably formed in areas of the chip where a low-k material is most beneficial, in one embodiment. In areas of the chip where the RC delay is not as critical, air gaps are preferably not formed. Thus, the regions not having air gaps or highly porous dielectric material provide a high mechanical strength for the interconnect structure, resulting in an integrated circuit with air gaps or porous dielectric material that has a stable structure.

Several methods of manufacturing integrated circuits in accordance with preferred embodiments of the present invention are described herein. In some embodiments, conductive lines are formed in a damascene process, and in others, conductive lines are formed using a subtractive etch process. In some embodiments, energy-sensitive dielectric materials are exposed to energy in a first region of a workpiece, but not in a second region, to form the air gaps or porous dielectric material in either the first or second region but not in the other second or first region of the workpiece. In other embodiments, an energy-insensitive dielectric material is disposed in a first region, and an energy sensitive material is disposed in a second region, so that the entire workpiece (e.g., both the first and second region) may be exposed to the energy to form the air gaps or porous dielectric material in the second region.

FIGS. 1 through 8 show cross-sectional views of an embodiment of the present invention at various stages of manufacturing, wherein a highly porous dielectric material or air gaps are formed in a closely-spaced region 112 of a dual damascene structure. With reference first to FIG. 1, a semiconductor device 100 is shown. The semiconductor device 100 comprises a workpiece 102. The workpiece 102 may include a semiconductor substrate comprising silicon or other semiconductor materials that may be covered by an insulating layer, for example. The workpiece 102 may include active components or circuits formed in the FEOL, not shown. The workpiece 102 may comprise silicon oxide over single-crystal silicon, for example. The workpiece 102 may include other conductive layers or other semiconductor elements, e.g. transistors, diodes, etc. Compound semiconductors, GaAs, InP, Si/Ge, or SiC, as examples, may be used in place of silicon.

An optional via level dielectric 104 may be disposed or formed over the workpiece 102, as shown. In the embodiments shown and described with reference to FIGS. 1 through 8, a dual damascene structure 121 is shown, wherein vias 116 and conductive lines 118 are formed simultaneously by filling patterns in insulating layers 104 and 106/108 with a conductive material (not shown in FIG. 1; see FIGS. 2 and 3). However, embodiments of the present invention may also be implemented in single damascene structures (not shown in FIG. 1; see the single damascene layer 338 of FIG. 10 and FIGS. 11 through 16) and/or in interconnect structures with conductive lines formed in a subtractive etch process (see FIGS. 17 through 20 and 21 through 24).

Referring again to FIG. 1, the optional via level dielectric 104 preferably comprises an insulating material such as $SiO_2$, SiN, carbon-doped oxide, an organic dielectric, or low-k insulating materials, as examples, although alternatively, the via level dielectric 104 may comprise other insulating materials. The via level dielectric 104 may comprise a thickness of about 1000 to 3000 Å, and may comprise a thickness of about 1500 Å or less, as example, although alternatively, the via level dielectric 104 may comprise other dimensions.

A first insulating material 106 is formed over the workpiece 102, or over the via level dielectric 104, if present. The first insulating material 106 preferably comprises an energy-sensitive material, in accordance with embodiments of the present invention. In one embodiment, the first insulating material 106 preferably comprises two components: a matrix material and a porogen material, as examples. In another embodiment, the first insulating material 106 preferably comprises only a porogen, for example. Alternatively, the first insulating material 106 may comprise other energy sensitive materials. The first insulating material 106 preferably comprises a thickness of about 800 to 5000 Å, and more preferably comprises a thickness of about 1500 Å or less, although alternatively, the first insulating material 106 may comprise other dimensions.

The first insulating material 106 preferably comprises a light-sensitive material, in one embodiment. The first insulating material 106 may also comprise a material that is sensitive to e-beam, plasma, or other forms of energy, for example. In one embodiment, the first insulating material 106 preferably comprises a matrix material and a decomposable porogen material that is sacrificially removed. The decomposable porogen material is preferably decomposable by light or by a combination of light and heat, for example. The matrix material may comprise a methylsilsesquioxane (MSQ) based material, and the decomposable porogen material may comprise a porogen organic compound that provides porosity to the matrix material of the first insulating material 106, as examples. The first insulating material 106 may comprise a templated film, for example. In this embodiment, the decomposable porogen material may be removed by a subsequent light or energy treatment, or a combination of a light or energy treatment and a heat treatment, and the matrix material will remain in the structure, forming a highly porous dielectric material.

In one embodiment, preferably, the first insulating material 106 preferably comprises a relatively high concentration of the porogen material and a relatively low concentration of the matrix material. For example, the first insulating material 106 preferably comprises about 55% or greater of the porogen material, and about 45% or less of the matrix material. More preferably, the first insulating material 106 preferably comprises about 75% or greater of the porogen material, and about 25% or less of the matrix material. In one embodiment, the first insulating material 106 preferably comprises 100% of the decomposable porogen material, and no matrix material is used in the first insulating material 106.

A second insulating material 108 is formed over the first insulating material 106. The second insulating material 108 preferably comprises a thickness less than the thickness of the first insulating material 106, in one embodiment. The second insulating material 108 preferably comprises a material that is harder than the first insulating material 106; e.g., the second insulating material 108 preferably comprises a stronger material than the first insulating material 106. The second insulating material 108 is preferably porous, to allow portions of or all of the first insulating material 106 to pass through, e.g., evaporate through, the second insulating material 108, when the workpiece 102 is subjected to heat and/or energy, to be described further herein. The second insulating material 108 may comprise a material adapted to allow the escape of gaseous molecular species of the first insulating material 106, for example. The material of the second insulating material 108 is preferably permeable to decomposition by-products of the sacrificial component of the first insulating material 106, in one embodiment.

The second insulating material 108 preferably comprises an MSQ type material, organic material, carbon doped oxide material, or silicon oxide having a small amount of porosity or free volume, as examples, although alternatively, the second insulating material 108 may comprise other materials. The second insulating material 108 may comprise the matrix material of the first insulating material 106 in one embodiment, for example. The second insulating material 108 may comprise a low density material, having open space between the material. For example, the material of the second insulating material 108 may comprise atoms having a relatively open microscopic structure. The second insulating material 108 may comprise a hard mask that protects the first insulating material 106. The second insulating material 108 may comprise a low density carbon-doped oxide or organic material, in one embodiment.

The second insulating material 108 preferably comprises a thickness of about 25% or less than the thickness of the first insulating material 106, for example. The second insulating material 108 preferably comprises a thickness of about 200 Å to 1300 Å, and more preferably comprises a thickness of about 400 Å or less, although alternatively, the second insulating material 108 may comprise other dimensions.

Figure 2:
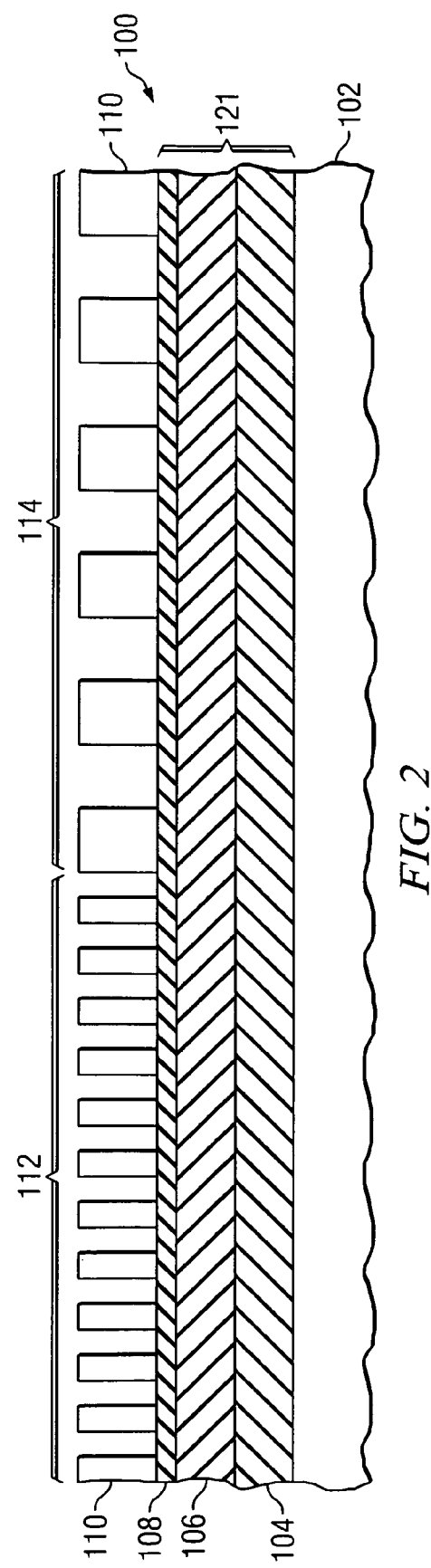

At least the first insulating material 106 and the second insulating material 108 are patterned with a predetermined pattern, as shown in FIG. 2, using lithography and etch processes. For example, a photoresist 110 may be deposited over the second insulating material 108, and the photoresist 110 may be patterned using a lithography mask (not shown). The photoresist 110 is then used as a mask while portions of the second insulating material 108 and the first insulating material 106 are etched away. The pattern formed in the first insulating material 106 and the second insulating material 108 preferably comprises a pattern for a plurality of conductive lines, in one embodiment.

In the embodiment shown, the via level dielectric 104 is patterned in a separate lithography step, which is typical for a dual damascene structure. The via level dielectric 104 may be patterned before or after the first insulating material 106 and the second insulating material 108 are patterned, using an additional layer of photoresist (not shown), and an additional lithography mask (also not shown). The patterns formed in the via level dielectric 104 may comprise patterns for vias that will provide electrical connection between areas of the workpiece 102 and the conductive lines formed in the first and second insulating materials 106 and 108, for example.

The pattern for the conductive lines may include a first region 112 of closely-spaced features, also referred to herein as dense features, and a second region 114 of widely-spaced features, also referred to herein as less dense features, as shown in FIG. 2. The first region 112 may comprise conductive lines 118 and spaces therebetween having a minimum feature size of the semiconductor device 100, as an example.

Figure 3:
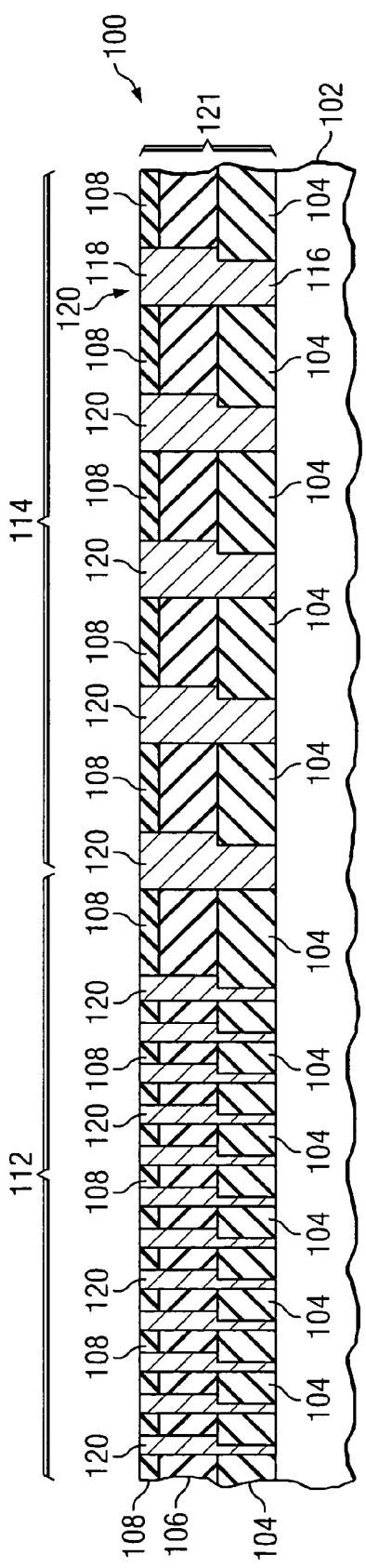

Referring next to FIG. 3, after the first insulating material 106, the second insulating material 108, and optional via level dielectric 104 are patterned, the photoresist layer 110 is removed, and a conductive material 120 is deposited over the workpiece 102, filling the patterns formed in the first insulating material 106, second insulating material 108, and via level dielectric 104. The conductive material 120 preferably comprises copper or a copper alloy in one embodiment, although alternatively, the conductive material 120 may comprise other conductive materials, such as aluminum or aluminum alloys, as examples, although other conductive materials may also be used. A barrier layer and/or liner may be deposited over the patterned insulating layers 106, 108, and 104 before depositing the conductive material 120, for example, not shown.

Excess conductive material 120 is removed from over the top surface of the second insulating material 108, leaving the structure shown in FIG. 3, with a plurality of conductive lines 118 formed in the first and second insulating material 106 and 108, and a plurality of vias 116 formed in the via level dielectric 104, as shown. The excess conductive material 120 may be removed using a chemical mechanical polish (CMP) process, an etch process, or combinations thereof, as examples.

The dielectric constant of the hybrid first and second insulating materials 106 and 108 disposed between the conductive lines 118 may comprise a dielectric constant of about 2.5 to about 3.5 at this stage of the manufacturing process, in one embodiment, for example.

Figure 4:
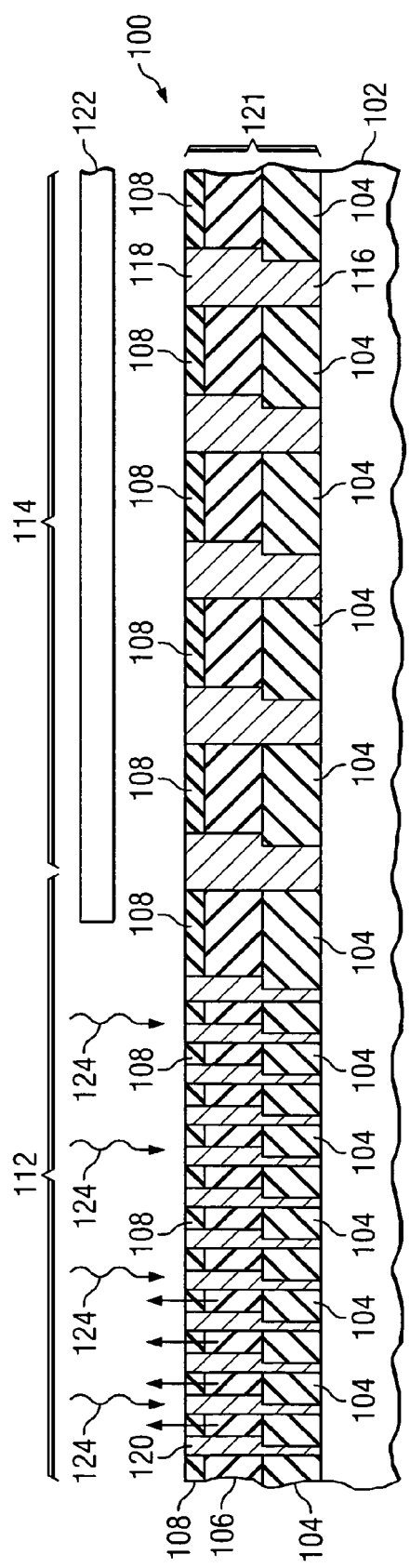
Figure 5:
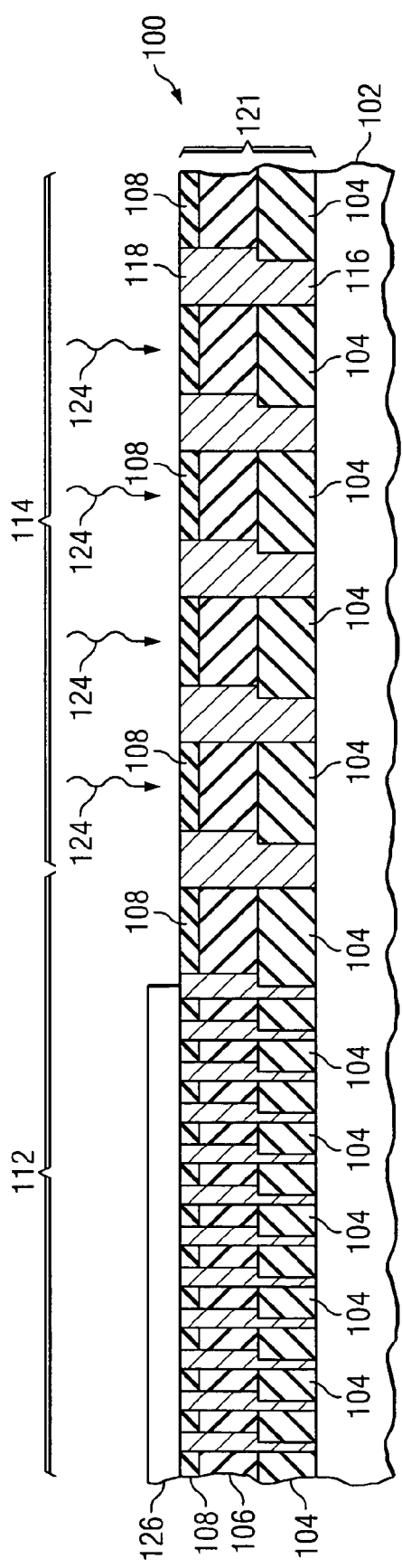
Figure 6:
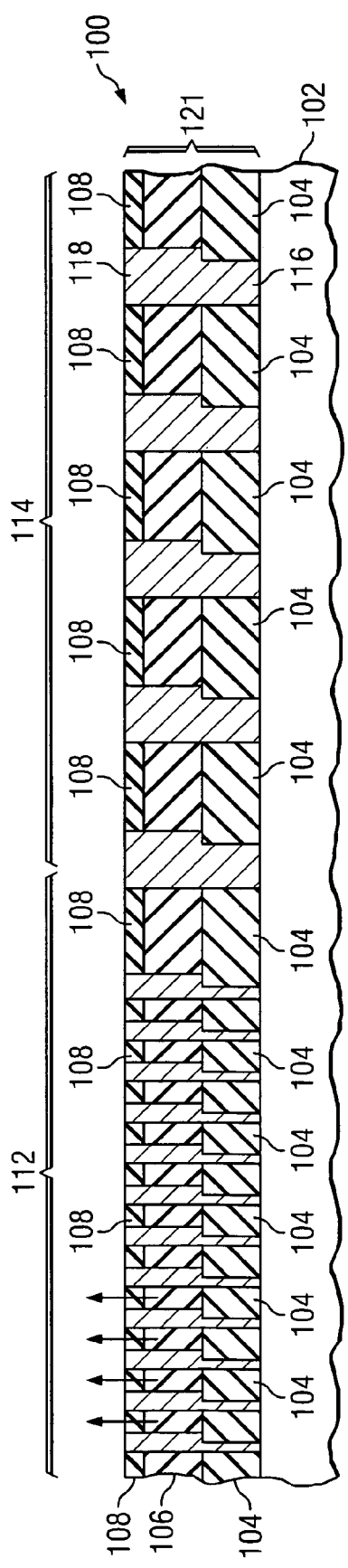

Next, either the first region 112 or the second region 114 of the workpiece 102 is exposed to energy 124 and optionally, heat, to alter the chemistry or structure of the first insulating material 106 and/or the second insulating material 108, as shown in FIGS. 4, 5, and 6, in accordance with embodiments of the present invention, which will be described further herein. Preferably, the first region 112 is treated differently than the second region 114, so that the first insulating material 106 comprises a first dielectric constant in the first region 112 and a second dielectric constant in the second region 114, wherein the second dielectric constant is greater than the first dielectric constant, for example.

Figure 8:
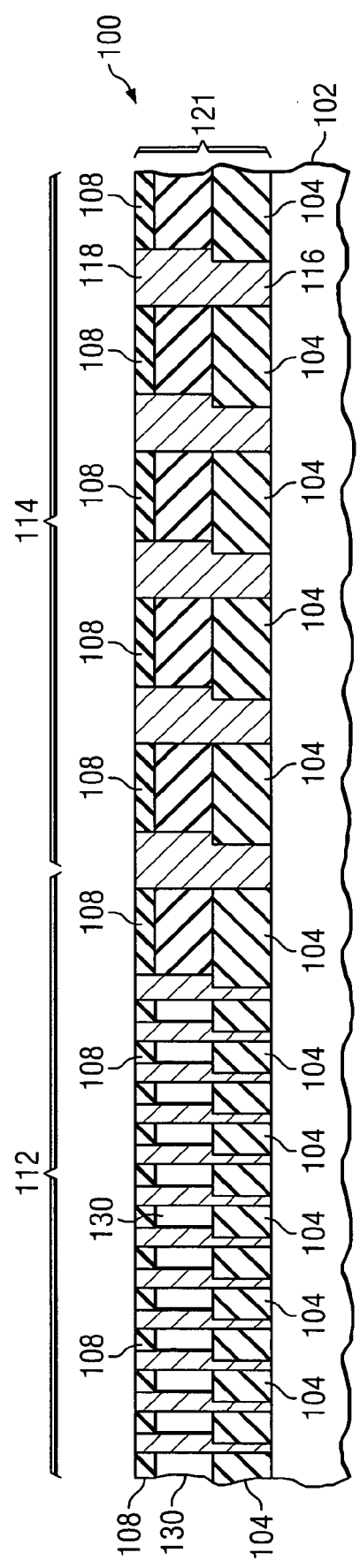

Preferably, after the energy 124 exposure and optional heat treatment, the first dielectric constant of the first insulating material 106 in the first region 112 comprises a k value of about 2.0 or less, and more preferably, comprises a k value of about 1.5 or less. In yet another embodiment, the first dielectric constant or the second dielectric constant comprises a k value of about 1.0; e.g., the first insulating material 106 in the first region 112, but not in the second region 114, comprises air or an air gap, as shown in FIG. 8.

In one embodiment, only the region 112 where air gaps 130 (see FIG. 8) or highly porous dielectric material 128 (see FIG. 7) are desired to be formed is exposed with the energy 124. For example, as shown in FIG. 4, region 112 having closely-spaced conductive lines 118 formed therein is exposed to energy 124, while region 114 is protected by a mask 122. The exposure to the energy 124 in this embodiment causes a chemical reaction in the first insulating material 106. The exposure to the energy 124 may cause all or a portion of the first insulating material 106 to directly escape through the porous second insulating material 108, in one embodiment.

Figure 7:
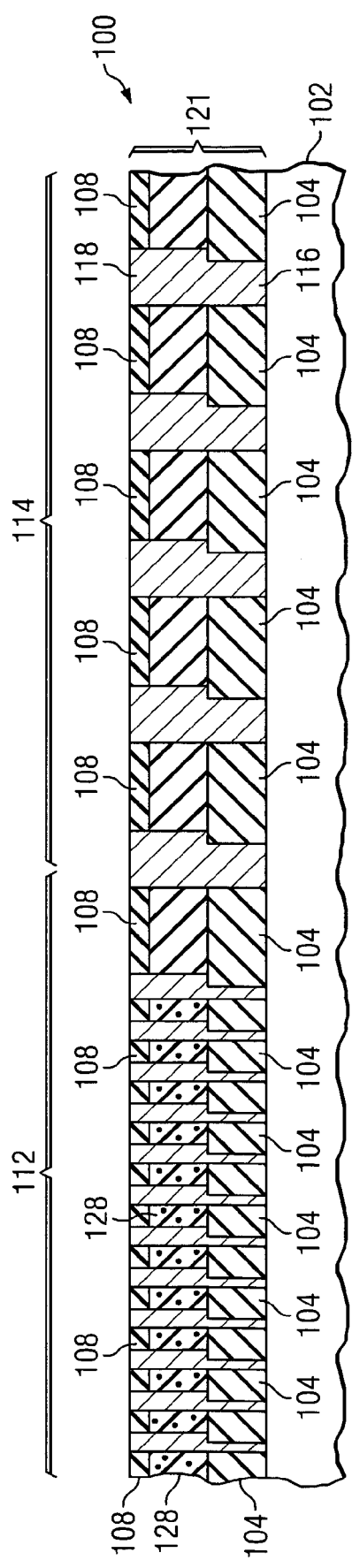

In another embodiment, the exposure to the energy 124 causes a chemical reaction in the first insulating material 106, and then the workpiece 102 is heated, causing all or a portion of the first insulating material 106 to directly escape through the second insulating material 108, for example. One possible resulting structure is shown in FIG. 7, wherein a highly porous dielectric material 128, comprising the matrix component of the first insulating material 108, (but not the porogen component, which has escaped through the second insulating material 108), is left disposed between conductive lines 118 in the first region 112, in the embodiment wherein a portion of the first insulating material 106 is removed. Another possible resulting structure is shown in FIG. 8, wherein air gaps 130 are left disposed between conductive lines 118 in the first region 112, in the embodiment wherein all of the first insulating material 106 is removed. In this embodiment, the first insulating material 106 may comprise 100% porogen material, for example, with no matrix component.

In the embodiment shown in FIG. 4, the porogen component of the first insulating material 106 is sensitive to the energy exposure, and exposing the workpiece 102 to the energy 124 essentially cracks the bonds of the porogen, causing the porogen component to be released through the second insulating material 108. In this embodiment, for example, the first insulating material 106 preferably comprises a photosensitive low k dielectric such as a carbon-doped oxide-porogen system or a UV curable spin-on material, and the second insulating material 108 preferably comprises a low porosity dielectric permeable to decomposition by-products of 106 during light exposure, as examples, although alternatively, the first and second insulating materials 106 and 108 may comprise other materials. If an optional heat treatment is used, preferably the heat treatment comprises a temperature of about 300 to 400 degrees C. for about 1 to 60 minutes, as examples, although other temperatures and times may be used.

In another embodiment, shown in FIG. 5, the energy 124 is used to harden the matrix component in the first insulating material 106 in the region 114 where it is desired not to remove a portion of the first insulating material 106. For example, the energy 124 may comprise ultraviolet (UV) light that is used to harden or cross-link the first insulating material 106 material in the second region 114, e.g., while the first region 112 is masked using mask 126, in the second region 114 where structural strength is desired in the interconnect layers, as shown in FIG. 5. Then, the workpiece 102 is heated, as shown in FIG. 6, to remove or burn out all or a portion of the first insulating material 106 through the second insulating material 108, leaving a highly porous dielectric material 128 disposed between the conductive lines 118, as shown in FIG. 7, or leaving air gaps 130 disposed between the conductive lines, as shown in FIG. 8, in the first region 112. In this embodiment, the heat treatment comprises a curing step that burns out the non-hardened material in the first region 112. In this embodiment, the first insulating material 106 preferably comprises a photosensitive low k dielectric material that further cross-links and hardens upon light exposure at a predetermined wavelength, and the second insulating material 108 preferably comprises a low porosity dielectric permeable to decomposition by-products of 106 during light exposure, as examples, although alternatively, the first and second insulating materials 106 and 108 may comprise other materials. The heat treatment in this embodiment preferably comprises a temperature of about 300 to 400 degrees C. for about 1 to 60 minutes, as examples, although other temperatures and times may be used.

The energy 124 that the desired region 112 or 114 is exposed to in order to change the material properties of the first and/or second insulating material 106 or 108 preferably comprises UV light, in one embodiment. Alternatively, the energy 124 may comprise light at a different wavelength than UV (also referred to herein as non-UV light), plasma or an electron beam (e-beam), as examples, although other forms of energy 124 may also be used. A mask (122 in FIG. 4 or 126 in FIG. 5) may optionally be used to mask one region 112 or 114 of the workpiece 102 while the other region 114 or 112, respectively, is exposed to the energy 124.

The mask 122 or 126 in either embodiment may comprise a photomask 126 that is formed directly on and abutting the top surface of the workpiece 102, e.g., on the second insulating material 108, as shown in FIG. 5, or the mask 122 or 126 may comprise a direct mask 122 disposed in close proximity to the workpiece 102, as shown in FIG. 4. The mask 122 or 126 pattern comprise relatively large patterns that represent the areas of the chip where discrimination is made between regions 112 that will have air gaps 130 (FIG. 8) or highly porous dielectric material (FIG. 7) formed therein, and regions 114 that will not have air gaps or highly porous dielectric material. However, if an e-beam is used, for example, a mask 122 or 126 may not be required.

The final porosity of the highly porous dielectric material 128 after the sacrificial component (namely, the porogen) is removed from the first insulating material 106, preferably comprises a porosity of about 50 to 100%.

The region 112 having the air gaps 130 or highly porous dielectric material 128 is less structurally stable or strong as the region 114 not having the air gaps 130 or highly porous dielectric material 128. However, advantageously, the region 114 not having the air gaps 130 or highly porous dielectric material 128 provides mechanical strength and stability so that the overall semiconductor device 100 is mechanically reliable.

Figure 9:
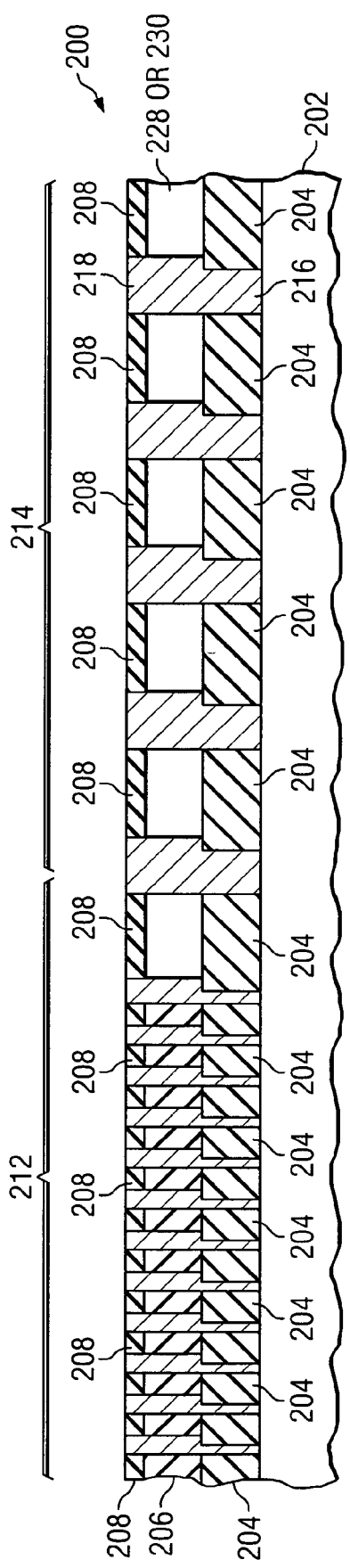
FIG. 9 shows another embodiment of the present invention, wherein the highly porous dielectric or air gaps are formed in a widely-spaced region of an interconnect layer.

In some applications, it may be desirable to form the highly porous dielectric material 128 or air gaps 130 between closely-spaced conductive lines 118, as shown in FIGS. 7 and 8, respectively. However, in other applications, it may be desirable to form highly porous dielectric material 228 or air gaps 230 between less dense or widely-spaced conductive lines 218, as shown in FIG. 9. Alternatively, in some applications it might be advantageous to form air gaps in particular functional blocks of the device having a plurality of line spacings (not shown), for example. FIG. 9 shows an embodiment of the present invention, in which similar process flows are preferably used as were described with reference to the embodiments shown in FIGS. 1 through 8. Similar reference numbers are designated for the various elements in FIG. 9 as were used in FIGS. 1 through 8. To avoid repetition, each reference number shown in FIG. 9 is not described in detail herein. Rather, similar materials and thicknesses described for x02, x04, etc . . . are preferably used for the material layers shown as were described for FIGS. 1 through 8, where x=1 in FIGS. 1 through 8 and x=2 in FIG. 9.

For example, if conductive lines 218 are run over component areas or active areas of the workpiece 202, it may be advantageous to form air gaps 230 or highly porous dielectric material 228 disposed between the conductive lines 218, as shown in FIG. 9.

Figure 10:
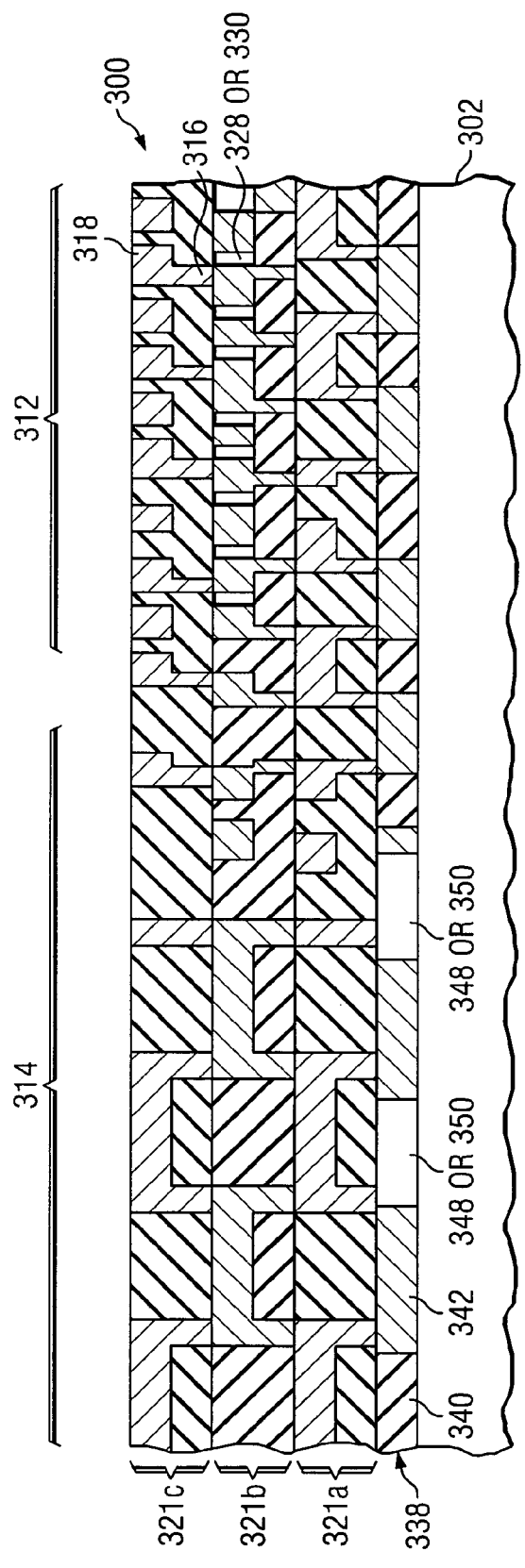
FIG. 10 shows embodiments of the invention implemented in a multi-layer interconnect structure.

FIG. 10 shows an embodiment of the invention implemented in a multi-layer interconnect structure, having a plurality of dual damascene interconnect layers 321a, 321b, and 321c. Because the second insulating material (not shown in FIG. 10; see FIG. 7 or 8 at 108) of each dual damascene interconnect layer 321a, 321b, and 321c is left remaining in the interconnect structure, additional metallization layers can be formed over the second insulating material 108 without filling in the air gaps 130 (shown as 328 or 330 in FIG. 10) formed, as shown in FIG. 10. Again, similar reference numbers are designated for the various elements in FIG. 10 as were used in FIGS. 1 through 8 and 9, and to avoid repetition, each reference number shown in FIG. 10 is not described in detail herein. Similar materials and thicknesses described for x02, x04, etc . . . are preferably used for the material layers shown as were described for FIGS. 1 through 8, and 9 where x=1 in FIGS. 1 through 8, x=2 in FIG. 9, and x=3 in FIG. 10.

As shown in FIG. 10, preferably, air gaps 330 or highly porous dielectric material 328 may be formed in a region 312 of one of the interconnect layers 321b having close ground rules or a minimum pitch, but preferably not within region 314 in that interconnect layer 321b. Conductive lines 318 in region 312 may have high resistance and capacitance, and may need improvement for low RC delay wiring, for example. In one embodiment of the invention, preferably no air gaps and/or highly porous dielectric material are formed within widely-spaced region 314, wherein the conductive lines 318 may have relaxed ground rules, low resistance and low capacitance, for example. Air gaps and/or highly porous dielectric material may also be formed in other metallization layers 321a and 321c within an interconnect structure of a semiconductor device 300, for example (not shown).

Highly porous dielectric material 348 and/or air gaps 350 may also be formed in a single damascene layer or subtractively formed metallization layer 338 in accordance with embodiments of the present invention, as shown. The highly porous dielectric material 348 and/or air gaps 350 may be formed in region 314 having widely-spaced features 342 formed in insulating layer 340 in this metallization layer 338, as shown, or alternatively, the highly porous dielectric material 348 or air gaps 350 may be formed in region 312, not shown. Similarly, highly porous dielectric material 328 and/or air gaps 330 may also be formed in region 314 having widely-spaced features, in dual damascene interconnect layers 321*a* or 321*c*, not shown. Preferably, in accordance with embodiments of the present invention, air gaps 330 or 350, and/or highly porous dielectric material 328 or 348, are formed only where needed to reduce the RC delay, leaving mechanically strong insulating material disposed elsewhere in the interconnect structure. Note also that air gaps 330 or 350 may be formed in some areas of the interconnect structure, and highly porous dielectric material 328 or 348 may be formed in other areas of the interconnect structure, for example, not shown.

Embodiments of the invention are particularly useful in multi-level interconnect structures such as the semiconductor device 300 shown in FIG. 10. There may be 8, 9 or a dozen or more metallization layers in an interconnect structure, for example. However, embodiments of the present invention are also useful in single level interconnect structures, for example.

FIGS. 11 through 16 show an embodiment of the present invention implemented in a damascene structure, wherein an energy insensitive material 460 is used as a dielectric material in the second region 414 of the workpiece 402, so that the entire workpiece 402 may be exposed to energy 424 to form air gaps or a porous dielectric material in the first region 412 of the workpiece 402. Again, similar reference numbers are designated for the various elements shown in FIGS. 11 through 16 as were used in FIGS. 1 through 8, 9, and 10, and to avoid repetition, each reference number shown in FIGS. 11 through 16 is not described in detail herein. Similar materials and thicknesses described for x02, x04, etc . . . are preferably used for the material layers shown as were described for FIGS. 1 through 8, 9, and 10, where x=1 in FIGS. 1 through 8, x=2 in FIG. 9, x=3 in FIG. 10, and x=4 in FIGS. 11 through 16.

In this embodiment, a workpiece 402 is provided, and an energy insensitive insulating material 460 is deposited over the entire workpiece 402, as shown in FIG. 11. The energy insensitive insulating material 460 preferably comprises a material that is insensitive to the energy 424 (see FIG. 15) that will be used to alter the properties of the first insulating material 406. For example, the energy insensitive insulating material 460 may comprise an oxide, a nitride, a carbon-doped oxide, or an organic dielectric, as examples, although alternatively, the energy insensitive insulating material 460 may comprise other materials that will not react with energy 424.

A photoresist 462 is deposited over the energy insensitive insulating material 460, as shown in FIG. 11, and the photoresist 462 is used to pattern the energy insensitive insulating material 460. For example, the energy insensitive insulating material 460 may be removed in the first region 412 of the workpiece 402, as shown in FIG. 12, in one embodiment.

The first insulating material 406 comprising an energy-sensitive material is then deposited over the energy insensitive insulating material 460 and exposed portions of the workpiece 402, as shown in FIG. 12. Any excess first insulating material 406 residing over the top surface of the energy insensitive insulating material 460 is removed, e.g., by a CMP, etch process, or combination thereof, leaving the structure shown in FIG. 13. The second insulating material 408 is deposited over the top surface of the first insulating material 406 and the energy insensitive insulating material 460, also shown in FIG. 13.

Figure 14:
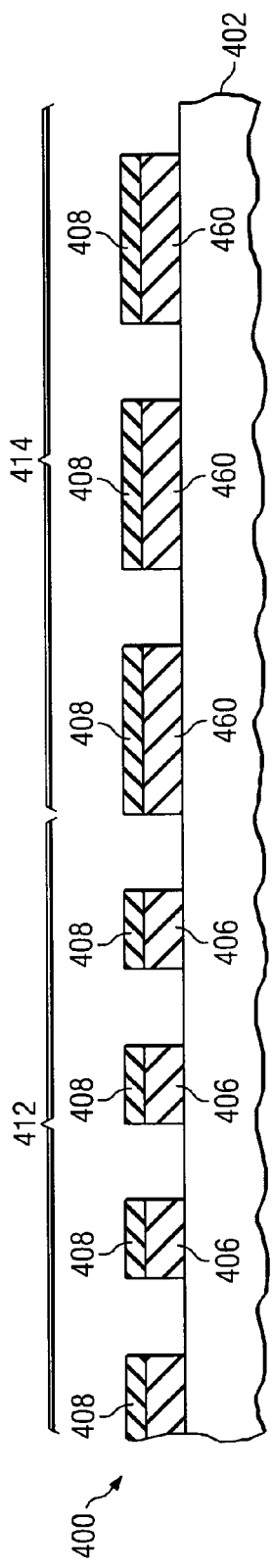

The second insulating material 408, first insulating material 406, and energy insensitive insulating material 460 are then patterned using lithography (e.g., using a photoresist and/or hard mask, not shown) with a desired pattern for a plurality of conductive lines, leaving the structure shown in FIG. 14. The patterns in the second insulating material 408, first insulating material 406, and energy insensitive insulating material 460 are filled with a conductive material, in a damascene process as described with reference to FIG. 3, forming conductive lines 418, as shown in FIG. 15.

Figure 15:
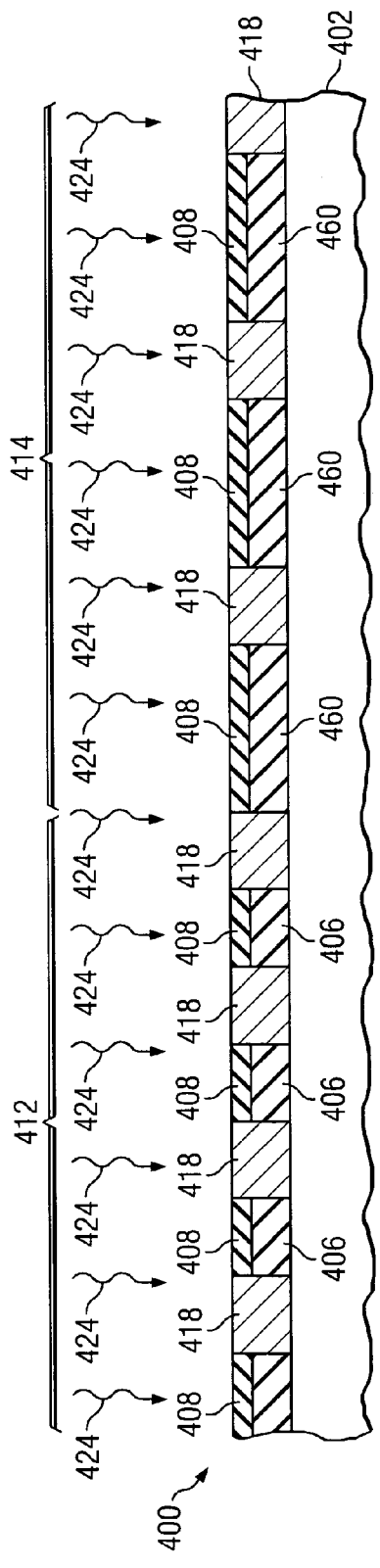

Advantageously, in this embodiment, the entire workpiece 402 may be exposed to energy 424 to cause the chemical change in the first insulating material 406, as shown in FIG. 15, in this embodiment. This is beneficial because in some processing tools, it may be difficult to prevent some portions of a workpiece 402 from being exposed to the energy 424. Because the energy insensitive insulating material 460 in the second region 414 does not react with or in response to the energy 424, the energy insensitive insulating material 460 is not altered by exposure to the energy 424, and the energy insensitive insulating material 460 provides strong structural support and mechanical reliability in the second region 414. However, in the first region 412, a highly porous dielectric material 428 or air gaps 430 are formed, as shown in FIG. 16, providing an extremely low dielectric constant in the first region 412 of the workpiece 402, for example.

Note that alternatively, the first insulating material 406 may be deposited and patterned first (not shown in the figures), rather than depositing the energy insensitive insulating material 460 first. In this embodiment, using lithography, the first insulating material 406 is removed in the second region 414. The energy insensitive insulating material 460 is then deposited over the first insulating material 406 in the first region 412, and over exposed portions of the workpiece 402 in the second region 414. Excess energy insensitive insulating material 460 is removed from over the top surface of the first insulating material 406 in the first region 412, and then the second insulating material 408 is deposited over both the first insulating material 406 and the energy insensitive insulating material 460. The manufacturing steps described with reference to FIGS. 15 and 16 are then performed on the workpiece 402 to form the air gaps or highly porous dielectric material 428 or 430 in the first region 412 between the conductive lines 418, as shown in FIG. 16.

Figure 16:
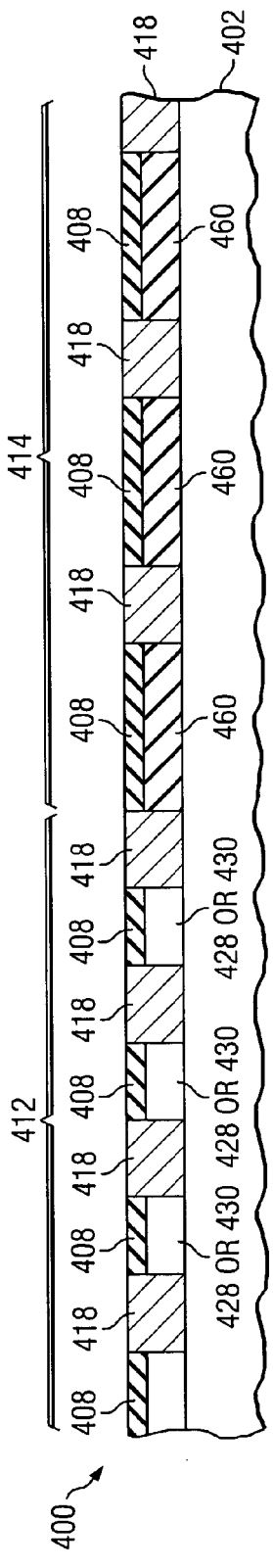

The semiconductor device 400 shown in FIGS. 15 and 16 may also optionally be heated, as described for the embodiment shown in FIGS. 1 through 8, for example.

FIGS. 17 through 20 show an embodiment of the present invention implemented in a structure having conductive lines formed by a subtractive etch process. Again, similar reference numbers are designated for the various elements shown in FIGS. 17 through 20 as were used in FIGS. 1 through 8, 9, 10, and 11 through 16, and to avoid repetition, each reference number shown in FIGS. 17 through 20 is not described in detail herein. Similar materials and thicknesses described for x02, x04, etc . . . are preferably used for the material layers shown as were described for FIGS. 1 through 8, 9, 10, and 11 through 16, where x=1 in FIGS. 1 through 8, x=2 in FIG. 9, x=3 in FIG. 10, x=4 in FIGS. 11 through 16, and x=5 in FIGS. 17 through 20.

In this embodiment, after the workpiece 502 is provided, a conductive material 570 is deposited or formed over the workpiece 502. The conductive material 570 may comprise similar materials as were described for the conductive material 120 (see FIG. 3) that the conductive lines 118 and vias 116 of the previous embodiments described herein are comprised of, for example. A photoresist 572 is deposited over the conductive material 570, as shown in FIG. 17. The photoresist 572 is used to pattern the conductive material 570 and form a plurality of conductive lines 574, as shown in FIG. 18. Because portions of the blanket-deposited conductive material 570 are removed, this etch process to form the conductive lines 574 is referred to herein as a "subtractive" etch process.

Next, the first insulating material 506 is deposited over the conductive lines 574 and exposed portions of the workpiece 502, as shown in FIG. 19. Excess portions of the first insulating material 507 (shown in phantom) residing over the top surface of the conductive lines 574 are removed, e.g., using a CMP process, etch process, or combinations thereof, as examples. The second insulating material 508 is deposited over the top surface of the first insulating material 506 and the top surface of the conductive lines 574, as shown in FIG. 20.

Figure 20:
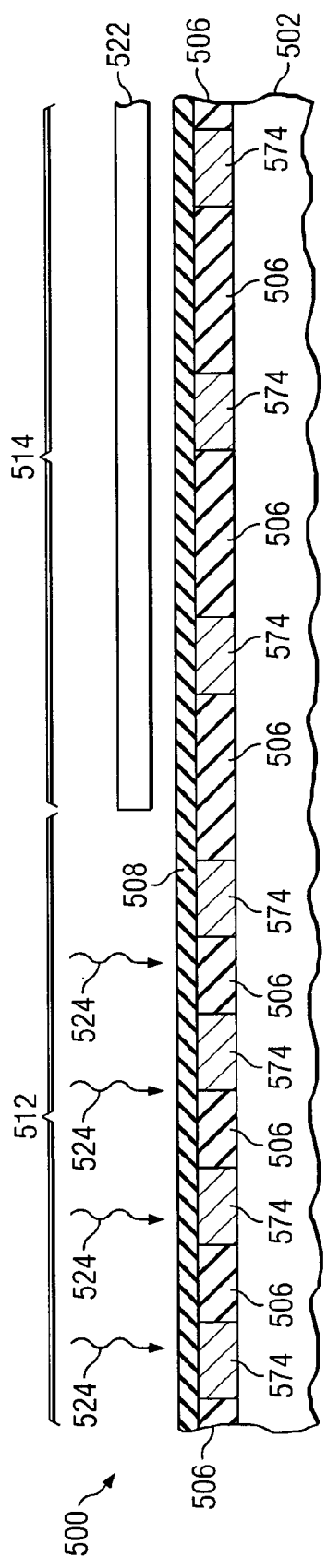

The second region 514 may be masked with a mask 522 while the first region 512 is exposed to energy 524, to alter the chemistry of the first insulating material 506 in the first region 512, as shown in FIG. 20. Alternatively, the first region 512 may be masked with a mask while the second region 514 is exposed to energy, to alter the chemistry of the first insulating material 506 in the second region 514 (not shown; see the embodiment shown in FIG. 5).

Thus, in the embodiment shown in FIGS. 17 through 20, an integrated circuit 500 is formed wherein the conductive lines 574 are formed using a subtractive etch process, and air gaps or a porous dielectric material (not shown in FIG. 20; see FIG. 16) are formed in the first region 512 between the conductive lines 574. In the second region 514, no air gaps or porous dielectric material are formed, providing strong structural support for the device 500.

The semiconductor device 500 shown in FIG. 20 may also optionally be heated, as described for the embodiment shown in FIGS. 1 through 8, for example.

FIGS. 21 through 24 show yet another embodiment of the present invention implemented in a conductive line structure formed by a subtractive etch process, wherein an energy insensitive material 660 is used as a dielectric material for the second region 614 of the workpiece 602, so that the entire workpiece 602 may be exposed to energy 624 to form air gaps in one region of the workpiece. Again, similar reference numbers are designated for the various elements shown in FIGS. 21 through 24 as were used in FIGS. 1 through 8, 9, 10, 11 through 16, and 17 through 20, and to avoid repetition, each reference number shown in FIGS. 21 through 24 is not described in detail herein. Similar materials and thicknesses described for x02, x04, etc . . . are preferably used for the material layers shown as were described for FIGS. 1 through 8, 9, 10, 11 through 16, and 16 through 20, where x=1 in FIGS. 1 through 8, x=2 in FIG. 9, x=3 in FIG. 10, x=4 in FIGS. 11 through 16, x=5 in FIGS. 17 through 20, and x=6 in FIGS. 21 through 24.

Figure 21:
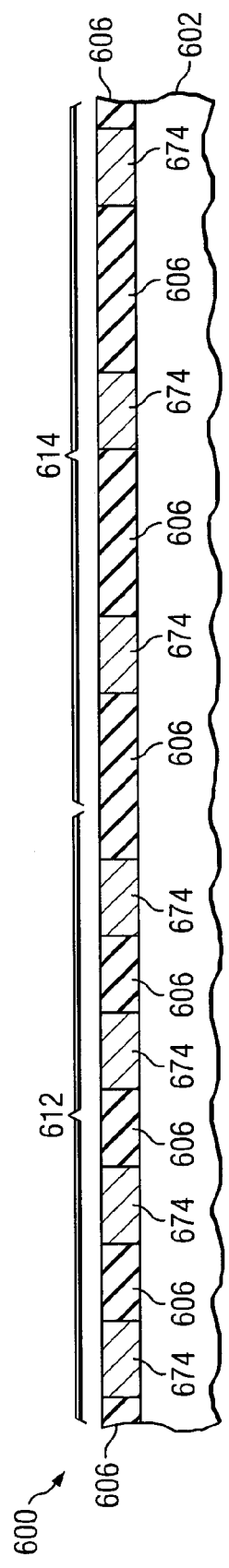
FIGS. 21 through 24 show yet another embodiment of the present invention implemented in a conductive line structure formed by a subtractive etch process, wherein an energy insensitive material is used as a dielectric for one region of the workpiece, so that the entire workpiece may be exposed to energy to form air gaps in one region of the workpiece.
Figure 22:
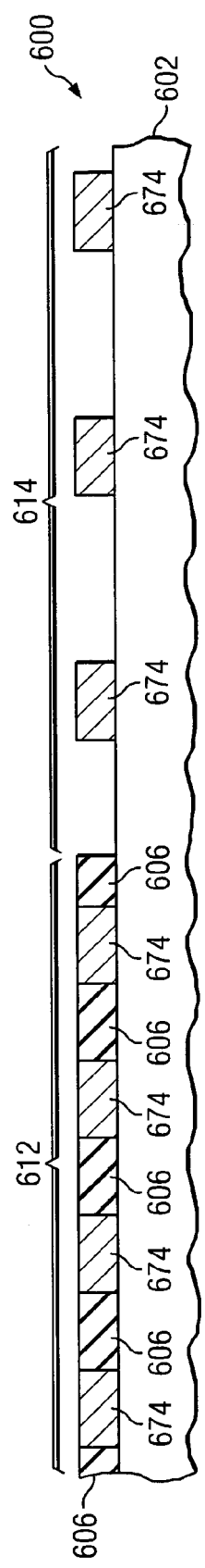
Figure 23:
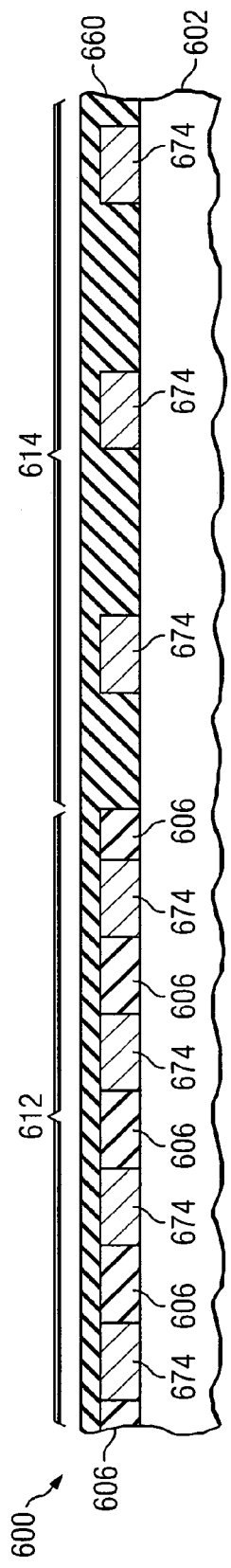
Figure 24:
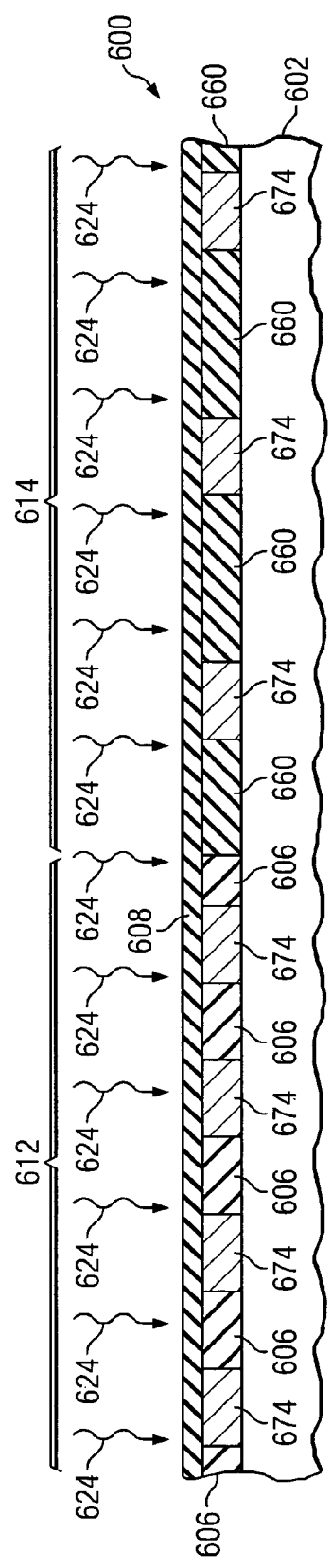

This embodiment is similar to the embodiment described with reference to FIGS. 11 through 15 in that an energy insensitive insulating material 660 is used in the second region 614 to provide structural support and to provide the ability to treat the entire workpiece 602 with the energy 624. However, in this embodiment, first, the first insulating material 606 is deposited over and between the conductive lines 674, as shown in FIG. 21. The first insulating material 606 is patterned, removing the first insulating material 606 from the second region 614, as shown in FIG. 22. Next, the energy insensitive insulating material 660 is deposited over the first insulating material 606, the conductive lines 674 in the second region 614, and over exposed portions of the workpiece 602 in the second region 614, as shown in FIG. 23. Excess portions of the energy insensitive insulating material 660 are removed, and the second insulating material 608 is deposited over the first insulating material 606 in the first region 612 and over the energy insensitive insulating material 660 in the second region 614, as shown in FIG. 24. Advantageously, the entire workpiece 602 may be exposed to the energy 624 in this embodiment to effect the change in the first insulating material 606 to form the air gaps or porous dielectric material (not shown in FIG. 24; see FIG. 16) in the first region 612.

Note that alternatively, the energy insensitive insulating material 660 may be deposited and patterned first (not shown in the figures), rather than depositing the first insulating material 606 first. In this embodiment, using lithography, the energy insensitive insulating material 660 is removed in the first region 612. The first insulating material 606 is then deposited over the energy insensitive insulating material 660 in the second region 612, and over exposed portions of the workpiece 602 in the first region 612. Excess first insulating material 606 is removed from over the top surface of the energy insensitive insulating material 660 in the second region 612, and then the second insulating material 608 is deposited over both the first insulating material 606 and the energy insensitive insulating material 660. The manufacturing steps described with reference to FIG. 24 are then performed on the workpiece 602 to form the air gaps or highly porous dielectric material in the first region 612 between the conductive lines 674 (not shown in FIG. 24; see FIG. 16).

The semiconductor device 600 shown in FIG. 24 may also optionally be heated, as described for the embodiment shown in FIGS. 1 through 8, for example.

Preferably, the air gaps and/or porous dielectric material described herein are formed between densely packed conductive lines, to reduce the RC delay of the interconnect structure. For example, in a memory chip, air gaps and/or porous dielectric material are preferably formed between the interconnect overlying the memory array that is densely packed (e.g., the conductive lines and spaces therebetween may comprise a minimum feature size of the chip), yet preferably air gaps are not formed in the interconnect regions of periphery circuits and support circuits, which may be less densely packed. As another example, in a microprocessor chip, in lower and/or intermediate levels of interconnect (e.g., the first through third metallization layers) that are densely packed, air gaps and/or porous dielectric material are preferably formed between conductive lines, yet at higher or upper-most levels of interconnect, which are less densely packed, preferably no air gaps and/or porous dielectric material are formed.

Regardless of a particular application for an integrated circuit, air gaps or highly porous dielectric material may be formed in some regions of an interconnect layer, providing an extremely low dielectric constant in those regions. Other regions of the same interconnect layer preferably have higher dielectric constant material disposed between the conductive lines, which is more structurally stable, thus producing an overall interconnect structure that is mechanically stable and reliable.

Embodiments of the present invention are particularly beneficial for integrated circuits that are application specific, that require a high performance BEOL and low RC delay, and that utilize copper as the material for the conductive lines, for example. Embodiments of the invention may be implemented in applications such as microprocessors, game station integrated circuits, and cell phone integrated circuits, as examples, although the invention may be used in other types of integrated circuits. However, embodiments of the present invention are also useful in other applications, having fewer metallization layers and utilizing aluminum as the material for the conductive lines, for example.

Advantages of embodiments of the invention include forming air gaps or highly porous dielectric material in critical areas, but not in non-critical areas, where the RC delay is not an issue. Because some regions of the workpiece do not have the air gaps or highly porous dielectric material disposed therein, the insulating material in those regions provides strong structural support and mechanical strength for the integrated circuit. An integrated circuit having air gaps between conductive lines, with a high level of mechanical stability, and increased reliability is provided. Partial implementation of air gaps and highly porous dielectric material provides an ultra-low dielectric that does not degrade overall mechanical performance of a device. A dielectric constant of close to or equal to one between conductive lines may be provided by embodiments of the present invention.

Using an energy insensitive insulating material 460 or 660 in the second region 414 or 614, respectively, as shown in FIGS. 11 through 16, and FIGS. 23 and 24, is particularly advantageous, because the energy insensitive insulating material 460 or 660 can provide better mechanical stability than the first insulating material in some embodiments, for example. Furthermore, the entire workpiece 402 or 602 may be exposed to the energy 424 or 624 used to alter the chemistry of the first insulating layer 406 or 606, if an energy insensitive insulating material 460 or 660 is used, rather than requiring the use of a mask.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming insulating regions between conductive lines of a semiconductor device, the method comprising:
    providing a workpiece, the workpiece comprising a first region and a second region;
    depositing a first insulating material over the workpiece;
    depositing a second insulating material over the first insulating material;
    patterning the second insulating material and the first insulating material with a pattern for a plurality of conductive lines in the first region and the second region; and
    filling the patterns in the second insulating material and the first insulating material to form a plurality of conductive lines, such that the plurality of conductive lines overlie the workpiece in the first region and the second region and the first insulating material is disposed between the plurality of conductive lines in at least the first region of the workpiece, and wherein the second insulating material overlies at least the first insulating material;
    exposing the workpiece to energy; and
    removing at least a portion of the first insulating material in the first region between the plurality of conductive lines through the second insulating material.

2. The method according to claim 1, wherein removing at least a portion of the first insulating material in the first region comprises removing all of the first insulating material in the first region, leaving air gaps between the plurality of conductive lines in the first region.

3. The method according to claim 1, wherein forming the first insulating material comprises depositing a decomposable porogen material.

4. The method according to claim 1, wherein forming the first insulating material comprises depositing at least one material selected from the group consisting of a porogen organic compound, a photosensitive low dielectric constant dielectric material, a carbon-doped oxideporogen system, and an ultraviolet (UV) light curable spin-on material, and wherein forming the second insulating material comprises depositing at least one material selected from the group consisting of an MSQ type material, organic material, carbon doped oxide material, and silicon oxide.

5. The method according to claim 1, wherein removing at least a portion of the first insulating material in the first region comprises leaving a porous dielectric material between the plurality of conductive lines in the first region.

6. The method according to claim 5, wherein forming the first insulating material comprises depositing a material comprising a matrix component and a porogen component, where removing at least a portion of the first insulating material in the first region comprises removing at least a portion of the porogen component of the first insulating material.

7. The method according to claim 1, wherein exposing the workpiece to energy comprises exposing the workpiece to energy selected from the group consisting of ultraviolet (UV) light, non-UV light, plasma, and an e-beam.

8. The method according to claim 1, wherein forming the first insulating material comprises depositing an energy-sensitive material, wherein removing at least a portion of the first insulating material in the first region comprises removing at least a portion of the first insulating material by exposing the first region to the energy.

9. The method according to claim 8, further comprising masking the second region, before exposing the workpiece in the first region to the energy.

10. The method according to claim 1, further comprising heating the workpiece, wherein heating the workpiece comprises removing at least a portion of the first insulating material in the first region.

11. The method according to claim 10, wherein heating the workpiece comprises heating the workpiece to about 300 to 400 degrees C. for about 1 to 60 minutes.

12. The method according to claim 1, wherein forming the first insulating material between the plurality of conductive lines in at least the first region further comprises forming the first insulating material in the second region of the workpiece between the plurality of conductive lines, wherein forming the first insulating material comprises depositing an energy-sensitive material, and wherein exposing workpiece to energy comprises exposing the second region, but not the first region, to the energy.

13. The method according to claim 12, wherein exposing the second region to the energy comprises hardening the first insulating material in the second region.

14. The method according to claim 12, further comprising masking the first region, before exposing the workpiece to the energy.

15. The method according to claim 12, further comprising heating the workpiece, wherein heating the workpiece comprises removing at least a portion of the insulating material in the first region.

16. The method according to claim 1, wherein forming the second insulating material comprises depositing a porous material, the porous material comprising a plurality of pores, wherein removing at least a portion of the first insulating material in the first region comprises removing at least a portion of the first insulating material through the pores of the second insulating material.

17. The method according to claim 1, wherein patterning the second insulating material and the first insulating material further comprises patterning the second insulating material and the first insulating material with a pattern for a plurality of vias in the first region and the second region, beneath the pattern for the plurality of conductive lines, and wherein filling the patterns in the second insulating material and the first insulating material further comprises forming a plurality of vias beneath the plurality of conductive lines.

18. The method according to claim 1, further comprising forming an energy insensitive insulating material between the plurality of conductive lines in the second region, wherein exposing the workpiece to energy comprises exposing both the first region and the second region of the workpiece to energy.

19. The method according to claim 18, wherein forming the plurality of conductive lines over the workpiece in the first region and the second region, the first insulating material between the plurality of conductive lines in at least the first region of the workpiece, and the second insulating material over at least the first insulating material comprises:
  first, depositing the energy insensitive insulating material over the workpiece;
  removing the energy insensitive insulating material from the first region of the workpiece;
  second, depositing the first insulating material over at least the first region of the workpiece;
  third, depositing the second insulating material over the first insulating material and the energy insensitive insulating material;
  patterning the second insulating material, the first insulating material, and the energy insensitive insulating material with a pattern for the plurality of conductive lines in the first region and the second region; and
  filling the patterns in the second insulating material, the first insulating material, and the energy insensitive insulating material to form the plurality of conductive lines.

20. The method according to claim 18, wherein forming the plurality of conductive lines over the workpiece in the first region and the second region, the first insulating material between the plurality of conductive lines in at least the first region of the workpiece, and the second insulating material over at least the first insulating material comprises:
  first, depositing the first insulating material over the workpiece;
  removing the first insulating material from the second region of the workpiece;
  second, depositing the energy insensitive insulating material over at least the second region of the workpiece;
  third, depositing the second insulating material over the first insulating material and the energy insensitive insulating material;
  patterning the second insulating material, the first insulating material, and the energy insensitive insulating material with a pattern for the plurality of conductive lines in the first region and the second region; and
  filling the patterns in the second insulating material, the first insulating material, and the energy insensitive insulating material to form the plurality of conductive lines.

21. The method according to claim 1, wherein forming the plurality of conductive lines over the workpiece in the first region and the second region comprises:
  depositing a conductive material over the workpiece; and
  patterning the conductive material to form the plurality of conductive lines in the first region and the second region.

22. The method according to claim 21, further comprising:
  depositing the first insulating material over and between the plurality of conductive lines;
  removing the first insulating material from over the plurality of conductive lines; and
  depositing the second insulating material over the first insulating material and the plurality of conductive lines; and
  masking the second region of the workpiece, before exposing the workpiece to energy.

23. A method of forming insulating regions between conductive lines of a semiconductor device, the method comprising:
  providing a workpiece, the workpiece comprising a first region and a second region;
  forming a plurality of conductive lines over the workpiece in the first region and the second region, wherein a first insulating material is disposed between the plurality of conductive lines in at least the first region of the workpiece and a second insulating material overlies at least the first insulating material;
  forming an energy insensitive insulating material between the plurality of conductive lines in the second region,
  exposing the workpiece to energy, wherein exposing the workpiece to energy comprises exposing both the first and the second region of the workpiece to energy; and
  removing at least a portion of the first insulating material in the first region between the plurality of conductive lines through the second insulating material; and
  wherein forming the plurality of conductive lines over the workpiece in the first region and the second region comprises:
  depositing a conductive material over the workpiece; and
  patterning the conductive material to form the plurality of conductive lines in the first region and the second region.

24. The method according to claim 23, further comprising:
  first, depositing the first insulating material over the workpiece between the plurality of conductive lines in the first region and the second region;
  removing the first insulating material from between the plurality of conductive lines in the second region of the workpiece;

second, depositing the energy insensitive insulating material over at least the second region of the workpiece; and third, depositing the second insulating material over the first insulating material, the energy insensitive insulating material, and the plurality of conductive lines.

25. The method according to claim 23, further comprising:
first, depositing the energy insensitive insulating material over the workpiece between the plurality of conductive lines in the first region and the second region;
removing the energy insensitive insulating material from between the plurality of conductive lines in the first region of the workpiece;
second, depositing the first insulating material over at least the first region of the workpiece; and
third, depositing the second insulating material over the first insulating material, the energy insensitive insulating material, and the plurality of conductive lines.

26. The method according to claim 23, further comprising masking the first region prior to exposing the workpiece to energy.

27. A method of forming insulating regions between conductive lines of a semiconductor device, the method comprising:
providing a workpiece, the workpiece comprising a first region and a second region;
forming a plurality of conductive lines over the workpiece in the first region and the second region, wherein a first insulating material is disposed between the plurality of conductive lines in both the first region and the second region of the workpiece and a second insulating material overlies at least the first insulating material, and wherein the first insulating material comprises an energy-sensitive material;
exposing the workpiece to energy, wherein exposing workpiece to energy comprises exposing the second region, but not the first region, to the energy; and
removing at least a portion of the first insulating material between the plurality of conductive lines through the second insulating material.

28. The method according to claim 27, wherein removing at least a portion of the first insulating material comprises removing at least a portion of the first insulating material in the first region.

29. The method according to claim 28, wherein exposing the second region to the energy comprises hardening the first insulating material in the second region.

30. The method according to claim 28, further comprising masking the first region, before exposing the workpiece to the energy.

31. The method according to claim 27, further comprising heating the workpiece, wherein heating the workpiece comprises removing the at least a portion of the insulating material in the first region.

32. The method according to claim 27, wherein removing the at least a portion of the first insulating material comprises removing the at Least a portion of the first insulating material in the second region by exposing the first region to the energy.

33. The method according to claim 27, wherein removing at least a portion of the first insulating material comprises removing all of the first insulating material in one of the first region or the second region thereby leaving air gaps between the plurality of conductive lines in the one of the first region or the second region.

34. The method according to claim 27, wherein forming the first insulating material comprises depositing a decomposable porogen material.

35. The method according to claim 27, wherein removing at least a portion of the first insulating material comprises leaving a porous dielectric material between the plurality of conductive lines in at least one of the first region or the second region.

36. The method according to claim 35, wherein forming the first insulating material comprises depositing a material comprising a matrix component and a porogen component, where removing the at least a portion of the first insulating material comprises removing at least a portion of the porogen component of the first insulating material.

37. The method according to claim 27, wherein forming the plurality of conductive lines over the workpiece in the first region and the second region, the first insulating material between the plurality of conductive lines in at least the first region of the workpiece, and the second insulating material over at least the first insulating material comprises:
depositing the first insulating material over the workpiece;
depositing the second insulating material over the first insulating material;
patterning the second insulating material and the first insulating material with a pattern for the plurality of conductive lines in the first region and the second region; and
filling the patterns in the second insulating material arid the first insulating material to form the plurality of conductive lines.

* * * * *